United States Patent
Arai et al.

(10) Patent No.: US 11,695,404 B2
(45) Date of Patent: Jul. 4, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kentaro Arai, Fujioka Gumma (JP); Toshifumi Ishimori, Yokohama Kanagawa (JP); Yutaka Yadoumaru, Kawasaki Kanagawa (JP); Masayoshi Takahashi, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/474,710

(22) Filed: Sep. 14, 2021

(65) Prior Publication Data

US 2022/0311430 A1    Sep. 29, 2022

(30) Foreign Application Priority Data

Mar. 24, 2021   (JP) ................................ 2021-049999

(51) Int. Cl.
*H03K 17/0812* (2006.01)
*H01L 27/02* (2006.01)

(52) U.S. Cl.
CPC ... *H03K 17/08122* (2013.01); *H01L 27/0288* (2013.01)

(58) Field of Classification Search
None
See application file for complete search history.

(56) References Cited

U.S. PATENT DOCUMENTS

| | | | | | |
|---|---|---|---|---|---|
| 5,963,019 | A | * | 10/1999 | Cheon | H02H 7/18 320/134 |
| 5,994,883 | A | * | 11/1999 | Liu | G05F 1/40 323/237 |
| 6,172,482 | B1 | * | 1/2001 | Eguchi | H02H 7/18 320/136 |
| 6,492,791 | B1 | * | 12/2002 | Saeki | H01M 10/425 320/135 |
| 6,885,168 | B2 | * | 4/2005 | Okumura | H01M 10/425 320/135 |
| 6,992,463 | B2 | * | 1/2006 | Yoshio | H02H 3/05 320/136 |
| 7,638,977 | B2 | * | 12/2009 | Park | H02J 7/0031 361/88 |

(Continued)

FOREIGN PATENT DOCUMENTS

| JP | 2680684 B2 | 1/1991 |
|---|---|---|
| JP | 4904851 B2 | 3/2012 |
| JP | 2012-195338 A | 10/2012 |

*Primary Examiner* — Kenneth B Wells
(74) *Attorney, Agent, or Firm* — Allen & Overy LLP (57) ABSTRACT

According to one embodiment, a semiconductor device includes a first circuit, a first terminal, a second terminal, a conductor and a first switch element serially coupled between the first terminal and the second terminal, wherein the first circuit is configured to turn the first switch element to an OFF state when a first condition is satisfied, and the conductor is configured to physically break when a second condition is satisfied.

6 Claims, 11 Drawing Sheets

(56) References Cited

U.S. PATENT DOCUMENTS

| | | | | |
|---|---|---|---|---|
| 8,802,257 | B2* | 8/2014 | Kim | H01M 10/482 |
| | | | | 429/61 |
| 9,190,833 | B2* | 11/2015 | Colby | H01H 85/048 |
| 10,424,915 | B2* | 9/2019 | Kang | H02J 7/0031 |
| 11,031,768 | B2* | 6/2021 | Bolanos | H02H 3/06 |
| 11,374,402 | B2* | 6/2022 | Bhat | H02H 9/044 |
| 2006/0108982 | A1* | 5/2006 | Daou | H02J 7/0031 |
| | | | | 320/116 |
| 2011/0187376 | A1* | 8/2011 | Barrenscheen | G01R 31/327 |
| | | | | 324/416 |
| 2013/0187451 | A1* | 7/2013 | Boe | H03K 17/18 |
| | | | | 327/419 |
| 2014/0266102 | A1* | 9/2014 | Mikolajczak | G05F 1/565 |
| | | | | 323/273 |
| 2016/0164273 | A1* | 6/2016 | Tseng | H02H 3/20 |
| | | | | 361/18 |
| 2017/0047758 | A1* | 2/2017 | Chatroux | H02J 7/345 |
| 2018/0145498 | A1* | 5/2018 | Handy | H02H 3/023 |
| 2019/0115750 | A1* | 4/2019 | Wu | H02H 9/008 |
| 2019/0273373 | A1* | 9/2019 | Li | H02H 1/0007 |
| 2021/0013709 | A1* | 1/2021 | Kang | H02H 7/26 |
| 2021/0066909 | A1* | 3/2021 | Ramadass | H02H 9/001 |
| 2021/0142970 | A1* | 5/2021 | Wölk | H01H 47/001 |

* cited by examiner

SEMICONDUCTOR DEVICE

CROSS-REFERENCE TO RELATED APPLICATIONS

This application is based upon and claims the benefit of priority from Japanese Patent Application No. 2021-049999, filed Mar. 24, 2021, the entire contents of which are incorporated herein by reference.

FIELD

Embodiments described herein relate generally to a semiconductor device.

BACKGROUND

A semiconductor device for protecting its surrounding apparatuses from excessive power by cutting the current path off has been known.

DETAILED DESCRIPTION

In general, according to one embodiment, a semiconductor device includes a first circuit, a first terminal, a second terminal, a conductor and a first switch element serially coupled between the first terminal and the second terminal, wherein the first circuit is configured to turn the first switch element to an OFF state when a first condition is satisfied, and the conductor is configured to physically break when a second condition is satisfied.

The embodiments will be explained below by referring to the drawings. In the following explanation, components having the same functions and configurations will be referred to by the same reference symbol.

1. Embodiment

A semiconductor device according to an embodiment will be described below.

1.1 Configuration

1.1.1 Power Supply System

Figure 1:
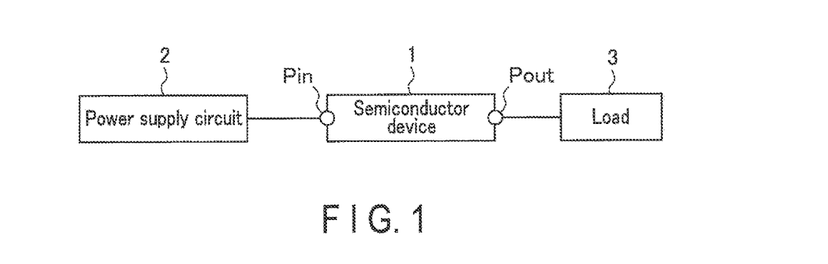
FIG. 1 is a block diagram showing an overall configuration of a power supply system including a semiconductor device according to an embodiment.

First, by referring to FIG. 1, the configuration of a power supply system including a semiconductor device according to the present embodiment will be explained. FIG. 1 is a block diagram showing an exemplary configuration of a power supply system including a semiconductor device 1 according to the present embodiment.

The semiconductor device 1 is a package of electronic parts. The semiconductor device 1 includes terminals Pin and Pout. The terminal Pin is coupled to a power supply circuit 2 externally provided with respect to the semiconductor device 1, for example. Power is suppled from the power supply circuit 2 to the terminal Pin. The terminal Pout is coupled to a load 3, which is externally provided with respect to the semiconductor device 1. Power is output from the terminal Pout to the load 3.

1.1.2 Semiconductor Device

Figure 2:
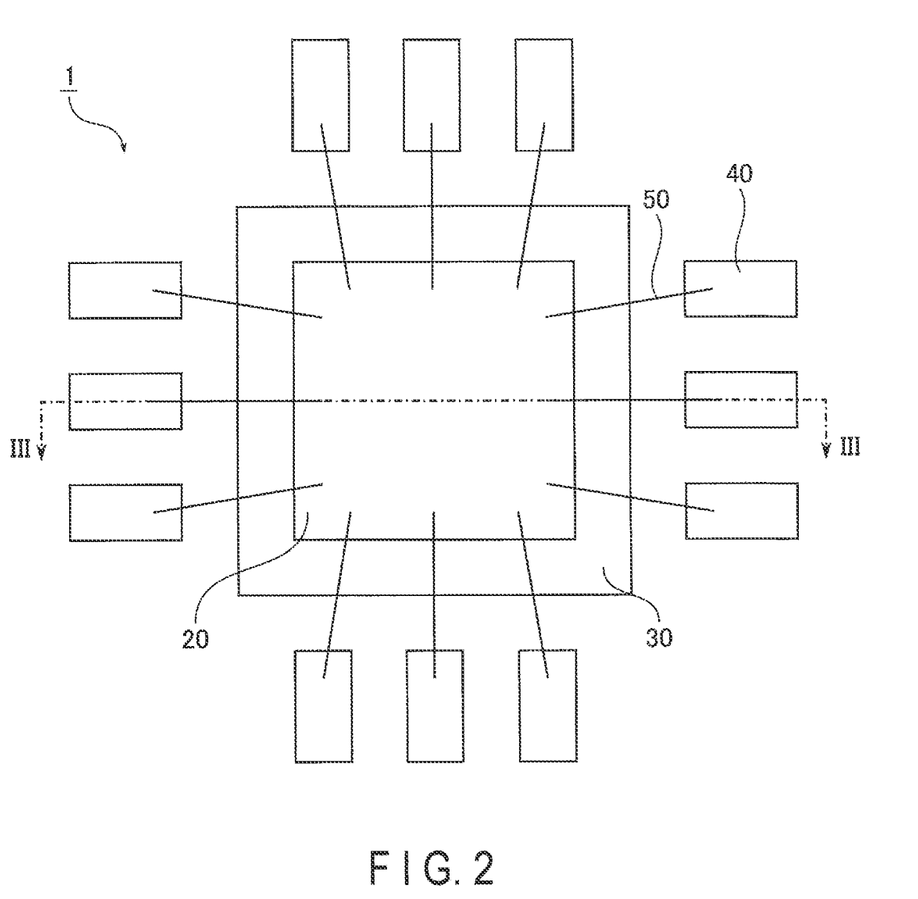
FIG. 2 is a plan view showing an overall configuration of the semiconductor device according to the embodiment.

FIG. 2 is a plan view for explaining the configuration of the semiconductor device according to the present embodiment.

The semiconductor device 1 includes a semiconductor chip 20, a bed portion 30, a plurality of lead terminals 40, and a plurality of wires 50. In FIG. 2, an insulator that covers the semiconductor chip 20, bed portion 30, lead terminals 40, and wires 50 is omitted.

The semiconductor chip 20 is arranged on the bed portion 30. In the following description, the direction toward the semiconductor chip 20 with respect to the bed portion 30 will be referred to as a top or upward direction. That is, the semiconductor chip 20 is arranged on the top surface of the bed portion 30. The bed portion 30 has a function of dissipating heat generated in the semiconductor device 1 to the outside of the semiconductor device 1.

The semiconductor chip 20 is electrically coupled to respective lead terminals 40 by way of the corresponding wires 50. With such wiring, the semiconductor chip 20 can receive power supplied from the outside of the semiconductor device 1 through the lead terminals 40. The semiconductor chip 20 can also output power to the outside of the semiconductor device 1 through the lead terminals 40.

Figure 3:
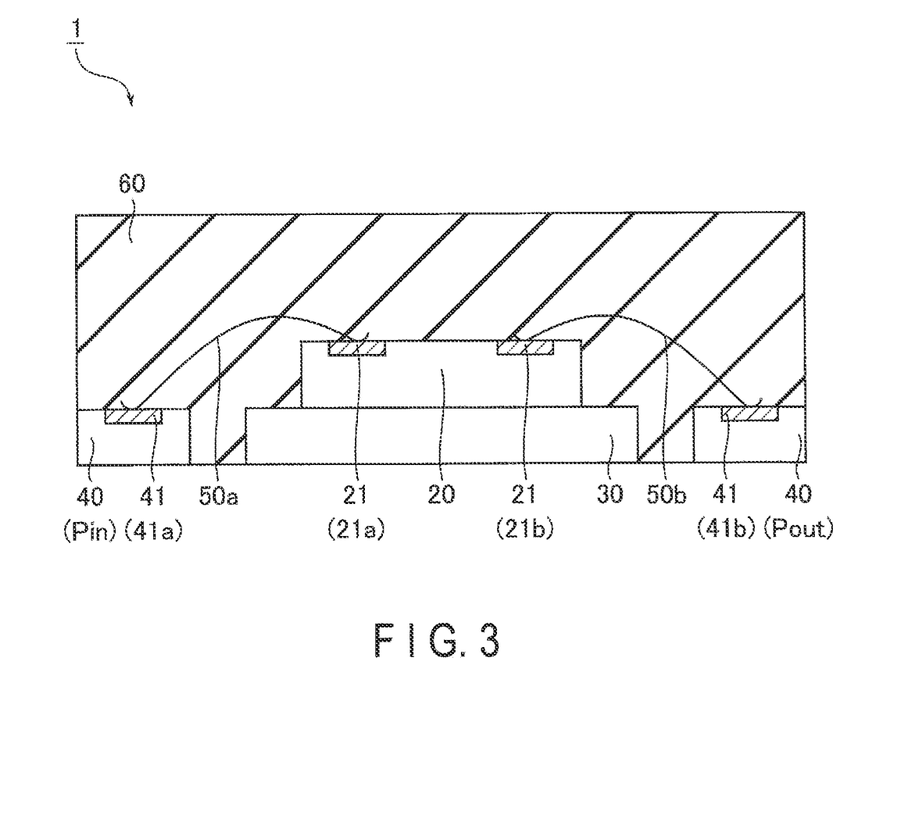
FIG. 3 is a cross-sectional view of the semiconductor device according to the embodiment taken along III-III in FIG. 2.

FIG. 3 is a cross-sectional view of the semiconductor device according to the present embodiment taken along III-III of FIG. 2.

As illustrated in FIG. 3, the semiconductor chip 20, bed portion 30, lead terminals 40, and wires 50 are sealed in with an insulator 60.

On the top surface of the semiconductor chip 20 are pad electrodes 21. The pad electrodes 21 include pad electrodes 21a and 21b.

On the top surface of the lead terminals 40 are pad electrodes 41. The pad electrodes 41 include pad electrodes 41a and 41b. The pad electrodes 41a correspond to the pad electrodes 21a. The pad electrodes 41b correspond to the pad electrodes 21b. The lead terminals 40 with the pad electrodes 41a function as terminals Pin. The lead terminals 40 with the pad electrodes 41b function as terminals Pout.

Each one of the pad electrodes 41 and the corresponding one of the pad electrodes 21 are physically and electrically coupled to each other by way of at least one of the wires 50. The wires 50 include wires 50a and 50b. A wire 50a includes a first end coupled to a pad electrode 21a and a second end coupled to the pad electrodes 41a. A wire 50b includes a first end coupled to a pad electrode 21b and a second end coupled to a pad electrode 41b.

Power is suppled from the outside of the semiconductor device 1 to the semiconductor chip 20 by way of the pad electrodes 41a, wires 50a, and pad electrodes 21a. In addition, power is output from the semiconductor chip 20 to the outside of the semiconductor device 1 by way of the pad electrodes 21b, wires 50b, and pad electrodes 41b.

1.1.3 Semiconductor Chip

Figure 4:
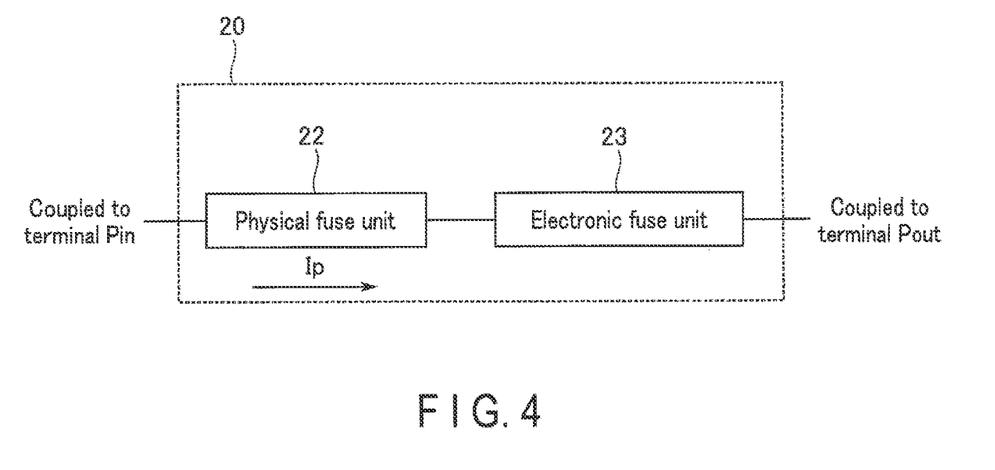
FIG. 4 is a block diagram explaining an exemplary configuration of a circuit included in the semiconductor chip of the semiconductor device according to the embodiment.

By referring to FIG. 4, the semiconductor chip 20 in the semiconductor device 1 according to the present embodiment will be explained. FIG. 4 is a block diagram showing an exemplary configuration of the circuit in the semiconductor chip of the semiconductor device according to the present embodiment.

The semiconductor chip 20 includes a physical fuse unit 22 and an electronic fuse unit 23. The physical fuse unit 22 and electronic fuse unit 23 are coupled in this order between the terminal Pin and the terminal Pout.

The physical fuse unit 22 is a wiring pattern of a conductor on the semiconductor chip 20, for example. The physical fuse unit 22 forms a conduction path connecting the terminal Pin to the electronic fuse unit 23. The physical fuse unit 22 is configured to blow in accordance with the current flowing through the physical fuse unit 22. In particular, the physical fuse unit 22 blows when the current value Ip of the current flowing through the physical fuse unit 22 is greater than or equal to a first current value I1 over a preset first time period. That is, the physical fuse unit 22 has a function of electrically insulating the terminal Pin and terminal Pout from each other by physically cutting the current path off between the terminal Pin and terminal Pout (hereinafter simply referred to as a "current path").

The electronic fuse unit 23 is an electronic circuit arranged, for example on the semiconductor chip 20. The electronic fuse unit 23 forms a conduction path connecting the physical fuse unit 22 to the terminal Pout. The electronic fuse unit 23 is configured to electrically insulate the terminal Pin and terminal Pout from each other while maintaining the physical connection of the current path, based on the current flowing through the physical fuse unit 22. In particular, the electronic fuse unit 23 is configured to electrically insulate the terminal Pin and terminal Pout from each other while maintaining the physical connection of the current path, for example when the current value Ip is greater than or equal to the second current value I2, where the second current value I2 is smaller than the first current value I1.

1.1.4 Electronic Fuse Unit

Figure 5:
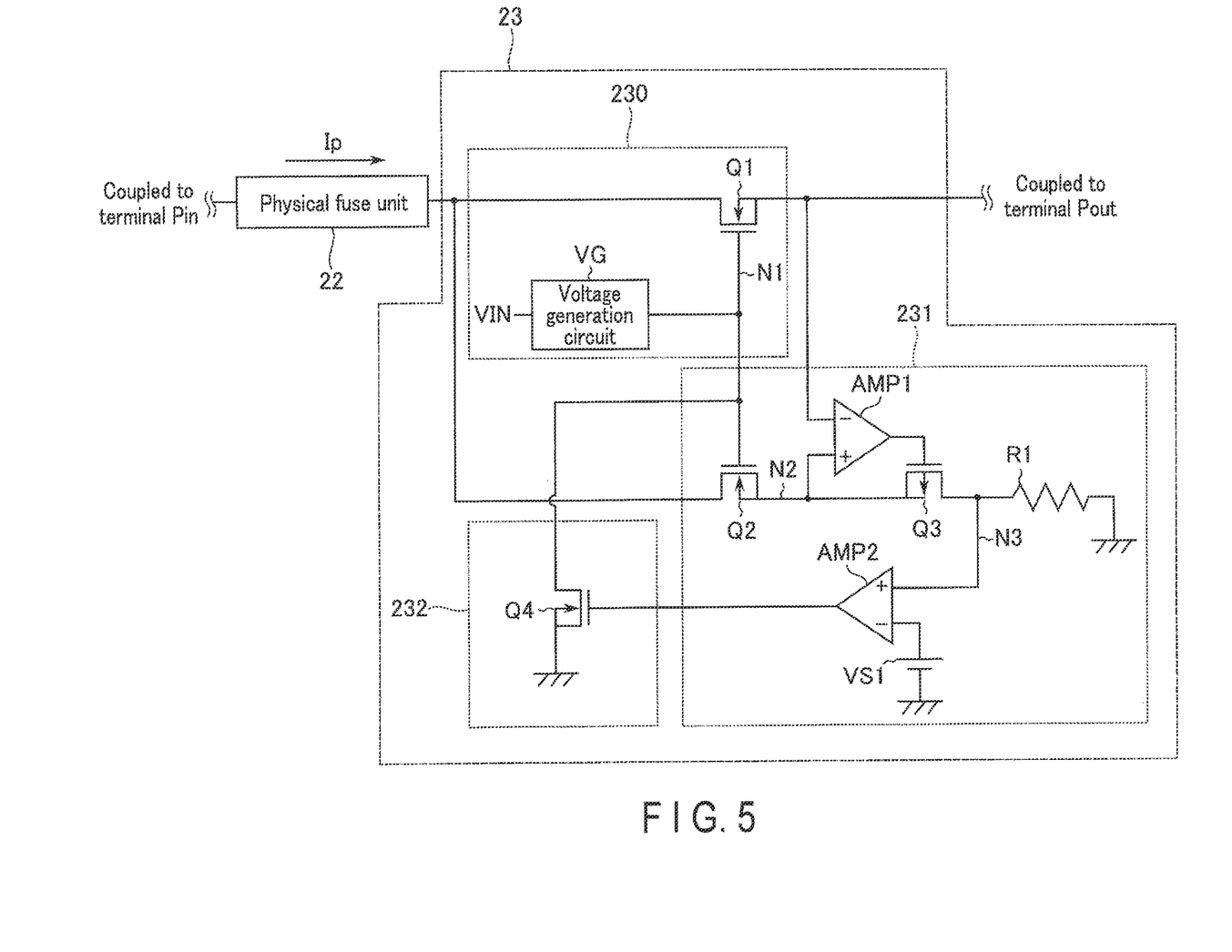
FIG. 5 is a circuit diagram explaining an exemplary configuration of circuits included in an electronic fuse unit of the semiconductor device according to the embodiment and an exemplary connection between the electronic fuse unit and a physical fuse unit.

By referring to FIG. 5, a specific configuration of the electronic fuse unit 23 of the semiconductor device 1 according to the present embodiment will be explained. FIG. 5 is a circuit diagram explaining the configuration of the circuits in the electronic fuse unit according to the present embodiment, and an exemplary connection of the electronic fuse unit and physical fuse unit.

The electronic fuse unit 23 includes a switch circuit 230, a detection circuit 231, and a control circuit 232.

The switch circuit 230 includes a switch element Q1 and a voltage generation circuit VG. The switch element Q1 is an N-type metal-oxide-semiconductor field effect transistor (MOSFET).

The first end of the switch element Q1 is coupled to the physical fuse unit 22. A current is supplied to the first end of the switch element Q1 by way of the physical fuse unit 22. The gate of the switch element Q1 is coupled to a node N1. The second end of the switch element Q1 is coupled to the terminal Pout.

A voltage VIN is input to the first end of the voltage generation circuit VG. The second end of the voltage generation circuit VG is coupled to the node N1. The voltage generation circuit VG boosts the voltage VIN. The voltage boosted by the voltage generation circuit VG is output through the second end of the voltage generation circuit VG.

The detection circuit 231 includes switch elements Q2 and Q3, a resistor R1, operational amplifiers AMP1 and AMP2, and a constant voltage source VS1. The switch element Q2 is an N-type MOSFET. The switch element Q3 is a P-type MOSFET.

The first end of the switch element Q2 is coupled to the first end of the switch element Q1. The gate of the switch element Q2 is coupled to the node N1. The second end of the switch element Q2 is coupled to a node N2.

The first end of the switch element Q3 is coupled to the node N2. The gate of the switch element Q3 is coupled to the operational amplifier AMP1. The second end of the switch element Q3 is coupled to a node N3.

The first end of the resistor R1 is coupled to the node N3. The second end of the resistor R1 is grounded.

The operational amplifier AMP1 includes a non-inverting input terminal (+), an inverting input terminal (−), and an output terminal. The non-inverting input terminal (+) of the operational amplifier AMP1 is coupled to the node N2. The inverting input terminal (−) of the operational amplifier AMP1 is coupled to the second end of the switch element Q1. The output terminal of the operational amplifier AMP1 is coupled to the gate of the switch element Q3.

The operational amplifier AMP2 includes a non-inverting input terminal (+), an inverting input terminal (−), and an output terminal. The non-inverting input terminal (+) of the operational amplifier AMP2 is coupled to the node N3. The inverting input terminal (−) of the operational amplifier AMP2 is coupled to the constant voltage source VS1. The output terminal of the operational amplifier AMP2 is coupled to the control circuit 232.

The first end of the constant voltage source VS1 is coupled to the inverting input terminal (−) of the operational amplifier AMP2. The second end of the constant voltage source VS1 is grounded. The constant voltage source VS1 is configured to output a voltage Vs from the first end of the constant voltage source VS1. The voltage Vs may be approximately equal to the voltage of the node N3 at the time of the current value Ip being approximately equal to the second current value I2.

The control circuit 232 includes a switch element Q4. The switch element Q4 is an N-type MOSFET.

The first end of the switch element Q4 is coupled to the node N1. The gate of the switch element Q4 is coupled to the output terminal of the operational amplifier AMP2. The second end of the switch element Q4 is grounded.

1.2 Operations

Figure 6:
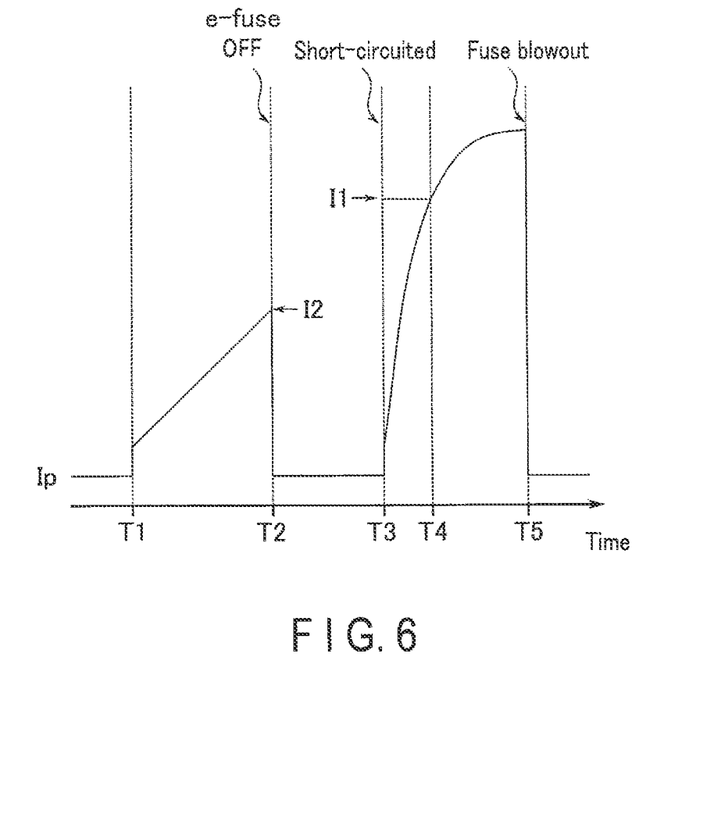
FIG. 6 is a timing chart explaining an exemplary operation using the semiconductor device according to the embodiment.

Next, by referring to FIG. 6, the operation of the semiconductor device 1 according to the present embodiment will be explained. FIG. 6 is a timing chart of an exemplary operation of the semiconductor device according to the embodiment. In the example of FIG. 6, the electrical insulation established between the terminal Pin and terminal Pout by the physical fuse unit 22 and the electrical insulation established between the terminal Pin and terminal Pout by the electronic fuse unit 23 are indicated. The current value Ip flowing through the physical fuse unit 22 is shown in FIG. 6.

At time T1, the power supply is initiated by the power supply circuit 2 to the load 3. In accordance with this, a current flows inside the semiconductor device 1.

In particular, the voltage generation circuit VG applies the same voltage to the gate of the switch element Q1 and to the gate of the switch element Q2. With the operation of the operational amplifier AMP1, the voltage at the inverting input terminal (−) of the operational amplifier AMP1 (i.e., at the second end of the switch element Q1) and the voltage at the non-inverting input terminal (+) of the operational amplifier AMP1 (i.e., at the node N2) become equal to each other, which makes the gate-source voltage of the switch elements Q1 and the gate-source voltage of the switch element Q2 equal to each other. With the operation of the operational amplifier AMP1, a voltage supply is also carried out from the output terminal of the operational amplifier AMP1 to the gate of the switch element Q3, which causes the switch element Q3 to enter an ON state. As a result, a current corresponding to the ratio of the size of the switch element Q2 to the switch element Q1 flows into the switch element Q2. The voltage at the second end of the switch element Q3 (i.e., at the node N3) is determined based on the current that flows into the switch element Q2.

The output terminal of the operational amplifier AMP2 outputs the comparison result between the voltage Vs at the inverting input terminal (−) of the operational amplifier AMP2 and the voltage at the non-inverting input terminal (+) of the operational amplifier AMP2 (i.e., at the node N3). Here, the current value Ip at time T1 is smaller than the second current value I2. The output terminal of the operational amplifier AMP2 therefore outputs an "L" (Low)-level signal. In response to the L-level signal, the switch element Q4 is turned to an OFF state.

When the switch element Q4 is in the OFF state, a voltage VON is applied to the node N1 due to a voltage from the voltage generation circuit VG. The voltage VON turns the switch elements Q1 and Q2 to the ON state. The switch elements Q1 and Q2 therefore stay in the ON state, which maintains the electrical connection between the terminal Pin and terminal Pout.

At time T2, the current value Ip becomes approximately equal to the second current value I2. In response, the electronic fuse unit 23 electrically insulates the terminal Pin and terminal Pout from each other ("e-fuse OFF" in FIG. 6), although the physical connection of the current path is maintained. Thus, the current from the terminal Pout is interrupted.

In particular, when the current value Ip becomes larger than or equal to the second current value I2, an "H" (High)-level signal is output from the output terminal of the operational amplifier AMP2. In response to the H-level signal, the switch element Q4 is turned to the ON state. The voltage at the node N1 therefore decreases, for example from the voltage VON to the ground potential. This switches the switch element Q1 from the ON state to the OFF state.

In the example of FIG. 6, the voltage increases between time T2 and time T3. At one time point between time T2 and time T3, for example, the voltage applied to the first end of the switch element Q1 becomes an overvoltage, and at time T3, the switch element Q1 is turned to a short-circuited state ("Short-circuited" in FIG. 6). Then, a current starts to flow through the physical fuse unit 22.

At time T4, the current value Ip becomes approximately equal to the first current value I1.

The current value Ip is maintained at the first current value I1 or higher between time T4 and time T5. As a result, at time T5, the physical fuse unit 22 blows ("Fuse blowout" in FIG. 6). That is, the physical fuse unit 22 physically cuts the current path off to electrically insulate the terminal Pin and electronic fuse unit 23 from each other. As a result, the current flowing in the semiconductor device 1 is interrupted.

In accordance with the above, the operation of the semiconductor device 1 is completed.

1.3 Effect of Present Embodiment

The semiconductor chip 20 of the semiconductor device 1 according to the present embodiment includes a terminal Pin, a terminal Pout, a physical fuse unit 22 and a switch element Q1 serially coupled between the terminal Pin and terminal Pout, and a control circuit 232. The control circuit 232 is configured to turn the switch element Q1 to an OFF state when a first condition is satisfied. The first condition represents, for example the current value Ip being larger than or equal to the second current value I2. In this manner, the semiconductor device 1 can electrically insulate the terminal Pin and terminal Pout from each other based on the current value Ip of the physical fuse unit 22 while maintaining the physical connection of the current path. The semiconductor device 1 therefore can repeatedly protect the semiconductor device 1 and its surrounding apparatuses from excessive power.

Furthermore, the physical fuse unit 22 is configured to be physically cut off when the first condition and second condition are satisfied. The second condition represents, for example the current value Ip being larger than or equal to the first current value I1 over the first time period. Thus, even in the event of the switch element Q1 falling into the short-circuited state after the switch element Q1 is turned to the OFF state, the semiconductor device 1 can electrically insulate the terminal Pin and electronic fuse unit 23 from each other by physically breaking the physical fuse unit 22. That is, even when the switch element Q1 causes a failure and becomes short-circuited, the current flowing in the semiconductor device 1 can be interrupted. As a result, a destruction of the surrounding apparatuses under excessive power supply can be prevented.

2. Modification Examples

Various modifications may be made to the above embodiment.

Semiconductor devices according to the modification examples will be explained below. In the following description, the configuration and operations of the semiconductor device 1 according to the modification examples will be explained, focusing on differences with respect to the semiconductor device according to the embodiment, and similar portions of the configuration and operations will be omitted. The semiconductor device according to the modification examples produce similar effects as in the embodiment.

2.1 Modification Example 1

The semiconductor chip 20 according to the embodiment is configured to electrically insulate the terminal Pin and terminal Pout from each other based on the current value Ip. The insulation, however, is not limited thereto. The semiconductor chip 20 may electrically insulate the terminal Pin and terminal Pout from each other based on a voltage Vp applied to the wiring pattern of the physical fuse unit 22 (hereinafter, simply referred to as the "voltage Vp of the physical fuse unit 22"). The voltage Vp of the physical fuse unit 22 indicates a voltage at one end of the wiring pattern of the physical fuse unit 22, which is coupled to the first end of the switch element Q1, for example.

2.1.1 Configuration

First, the configuration of the semiconductor device 1 according to the first modification example will be described. The configurations of a physical fuse unit 22 of the semiconductor chip 20, a bed portion 30, a plurality of lead terminals 40, and a plurality of wires 50 in the semiconductor device 1 according to the first modification example can be prepared in a manner similar to the embodiment, and therefore the explanation of these components will be omitted. The following description will focus mainly on the portions of the configuration of an electronic fuse unit 23 that differ from the corresponding ones of the embodiment, while omitting the rest of the configuration from the description.

2.1.1.1 Semiconductor Chip

The configuration of the electronic fuse unit 23 according to the first modification example will be explained.

The electronic fuse unit 23 is configured to electrically insulate the terminal Pin and terminal Pout from each other while maintaining the physical connection of the current path, for example when the voltage of the physical fuse unit 22 reaches the second voltage V2 or above. The rest of the configuration can be similar to the present embodiment.

2.1.1.2 Electronic Fuse Unit

Figure 7:
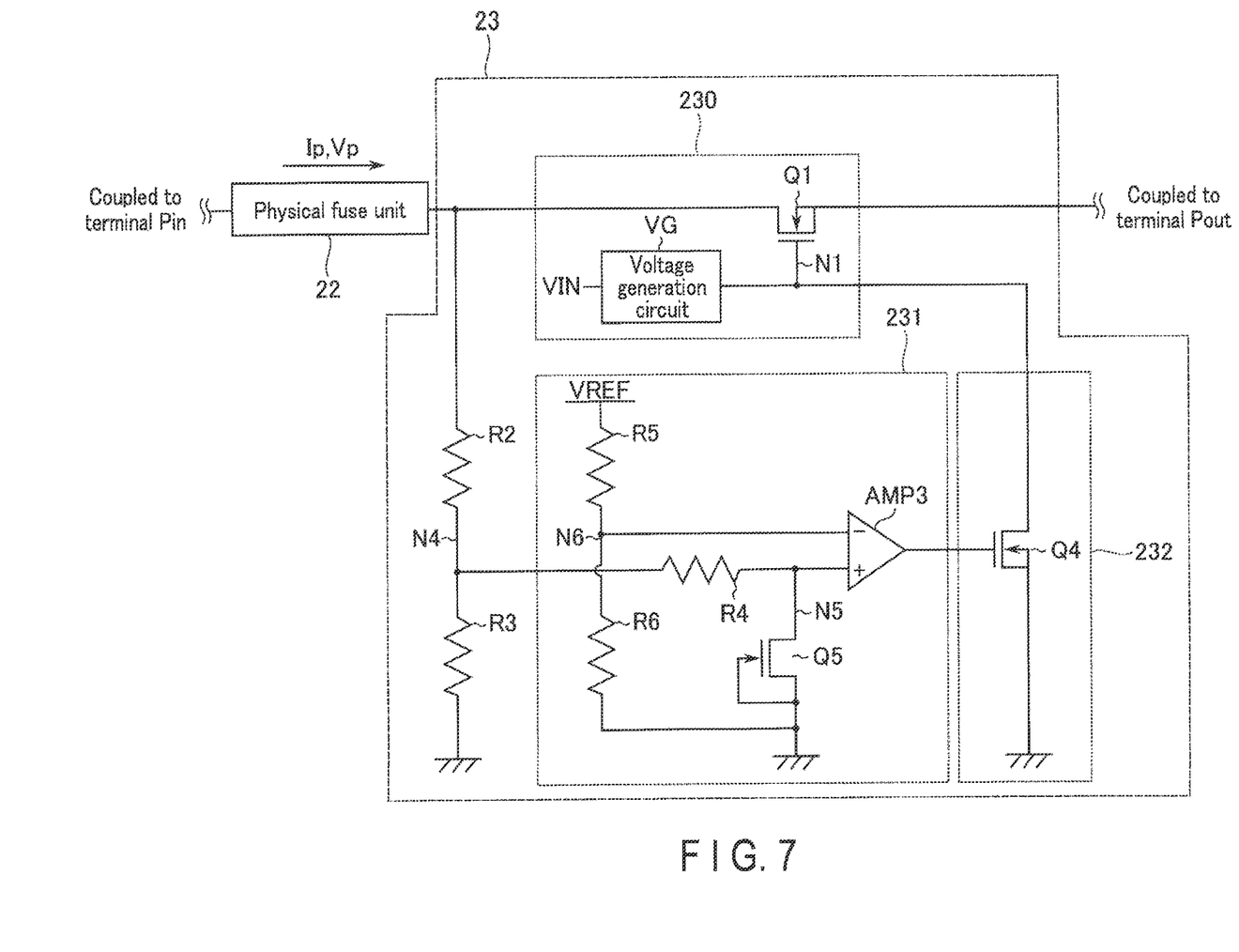
FIG. 7 is a circuit diagram explaining circuits included in a circuit electronic fuse unit of a semiconductor device according to a first modification example, and an exemplary connection between the electronic fuse unit and a physical fuse unit.

By referring to FIG. 7, the specific configuration of the electronic fuse unit 23 in the semiconductor device 1 according to the first modification example will be explained. FIG. 7 is a circuit diagram for explaining an example of the circuit configuration of the electronic fuse unit of the semiconductor device according to the first modification example and the connection between the electronic fuse unit and the physical fuse unit.

The electronic fuse unit 23 includes resistors R2 and R3, a switch circuit 230, a detection circuit 231, and a control circuit 232. For the switch circuit 230, the same configuration as in the embodiment can be adopted, and therefore the explanation is omitted.

The first end of the resistor R2 is coupled to the first end of the switch element Q1. A voltage based on the voltage Vp of the physical fuse unit 22 is supplied to the first end of the resistor R2 and to the first end of the switch element Q1. The second end of the resistor R2 is coupled to a node N4.

The first end of the resistor R3 is coupled to the node N4. The second end of the resistor R3 is grounded.

The detection circuit 231 includes a switch element Q5, an operational amplifier AMP3, and resistors R4, R5 and R6. The switch element Q5 may be an N-type junction field effect transistor (JFET).

The first end of the resistor R4 is coupled to the node N4. The second end of the resistor R4 is coupled to a node N5.

The voltage VREF is input to the first end of the resistor R5. The second end of the resistor R5 is coupled to a node N6. The voltage VREF is a constant voltage supplied, for example, from a not-shown constant voltage source.

The first end of the resistor R6 is coupled to the node N6. The second end of the resistor R6 is grounded.

The first end of the switch element Q5 is coupled to the node N5. The second end and gate of the switch element Q5 are grounded.

The operational amplifier AMP3 includes a non-inverting input terminal (+), an inverting input terminal (−), and an output terminal. The non-inverting input terminal (+) of the operational amplifier AMP3 is coupled to the node N5. The inverting input terminal (−) of the operational amplifier AMP3 is coupled to the node N6. The output terminal of the operational amplifier AMP3 is coupled to the control circuit 232.

The Control Circuit 232 Includes a Switch Element Q4.

The first end and second end of the switch element Q4 have the same configurations as those of the embodiment. The gate of the switch element Q4 is coupled to the output terminal of the operational amplifier AMP3.

2.1.2 Operations

Figure 8:
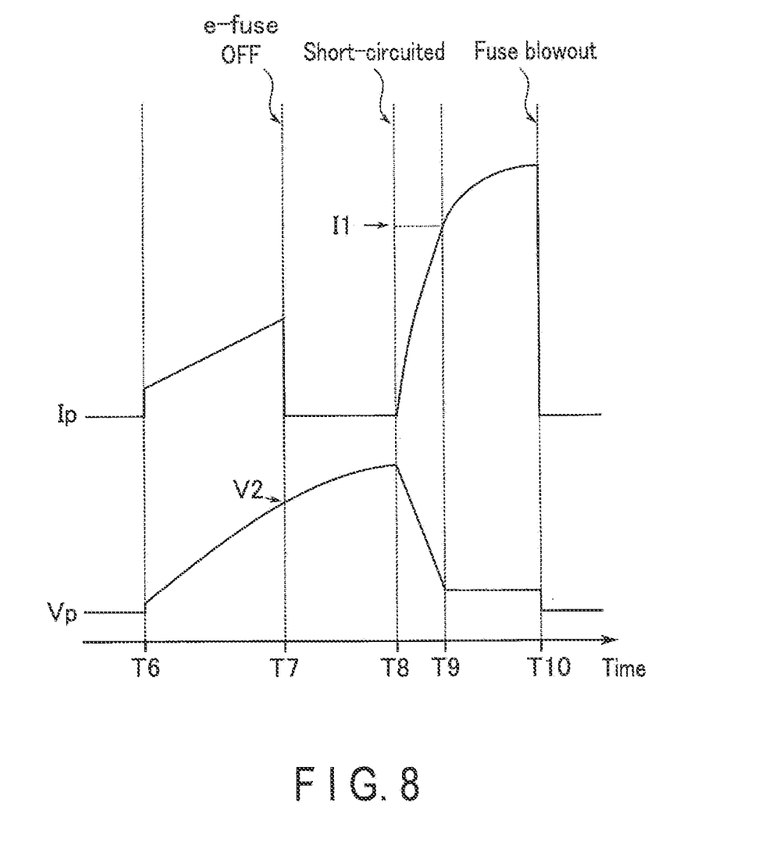
FIG. 8 is a timing chart explaining an exemplary operation using the semiconductor device according to the first modification example.

Next, by referring to FIG. 8, the operation of the semiconductor device 1 according to the first modification example will be explained. FIG. 8 is a timing chart of an exemplary operation of the semiconductor device according to the first modification example. In the example of FIG. 8, the electrical insulation established between the terminal Pin and terminal Pout by the physical fuse unit 22 and the electrical insulation established between the terminal Pin and terminal Pout by the electronic fuse unit 23 are indicated. FIG. 8 represents the current value Ip and the voltage Vp of the physical fuse unit 22.

At time T6, a power supply to the load 3 is initiated by the power supply circuit 2. In accordance with this, a current starts flowing inside the semiconductor device 1.

In particular, the voltage generation circuit VG applies a voltage to the gate of the switch element Q1. The output terminal of the operational amplifier AMP3 outputs the result of comparing the voltage at the inverting input terminal (−) of the operational amplifier AMP3 and the voltage at the non-inverting input terminal (+) of the operational amplifier AMP3. Here, the voltage VREF is determined such that the voltage at the inverting input terminal (−) of the operational amplifier AMP3 is approximately equal to the voltage at the non-inverting input terminal (+) of the operational amplifier AMP3 when the voltage Vp is approximately equal to the second voltage V2. The voltage Vp at time T6 is lower than the second voltage V2, and therefore an L-level signal is output from the output terminal of the operational amplifier AMP3. In this manner, the operational amplifier AMP3 outputs a signal indicating whether or not the voltage Vp is higher than or equal to the second voltage V2, based on the result of comparing the voltage at the non-inverting input terminal (+) of the operational amplifier AMP3, which is based on the voltage between the physical fuse unit 22 and electronic fuse unit 23, with the voltage at the inverting input terminal (−) of the operational amplifier AMP3.

In response to the L-level signal from the output terminal of the operational amplifier AMP3, the switch element Q4 is turned to the OFF state. On the other hand, the switch element Q1 is maintained in the ON state. Thus, the electrical connection between the terminal Pin and terminal Pout is maintained.

At time T7, the voltage of the physical fuse unit 22 becomes approximately equal to the second voltage V2. The electronic fuse unit 23 therefore electrically insulates the terminal Pin and terminal Pout from each other ("e-fuse OFF" in FIG. 8) while maintaining the physical connection of the current path. As a result, the current from the terminal Pout is interrupted. The current value Ip at time T7 is smaller than the first current value I1.

In particular, when the voltage Vp is approximately equal to the second voltage V2, an H-level signal is output from the output terminal of the operational amplifier AMP3, as a result of which the switch element Q4 is turned to the ON state at time T7. The voltage at the node N1 therefore decreases, for example from the voltage VON to the ground potential, and the switch element Q1 is switched from the ON state to the OFF state.

In the example of FIG. 8, the voltage Vp increases between time T7 and time T8. At one time point between time T7 and time T8, for example, the voltage Vp applied to the first end of the switch element Q1 becomes an overvoltage. For the same reason as at time T3 in the embodiment, the switch element Q1 falls into the short-circuited state ("Short-circuited" in FIG. 8) at time T8. As a result, a current starts to flow through the physical fuse unit 22, and accordingly, the voltage Vp starts decreasing.

At time T9, the current value Ip becomes approximately equal to the first current value I1.

Between time T9 and time T10, the current value Ip is maintained at the first current value I1 or higher. As a result, at time T10, the physical fuse unit 22 blows ("Fuse blowout" in FIG. 8). That is, the physical fuse unit 22 physically cuts the current path off to electrically insulate the terminal Pin and electronic fuse unit 23 from each other, thereby interrupting the current flowing in the semiconductor device 1.

With the above operation, the semiconductor device 1 can repeatedly protect the surrounding apparatuses from excessive power with the electronic fuse unit 23 configured to detect a voltage.

2.2 Modification Example 2

According to the above embodiment and the first modification example, the physical fuse unit 22 blows when the switch element Q1 is turned to the short-circuited state, which is not a limitation. The semiconductor device 1 may be configured to prevent the switch element Q1 of the embodiment from being turned to the short-circuited state. In the following explanation, the configuration and operation of the semiconductor device 1 according to the second modification example will be explained, focusing mainly on differences with respect to the embodiment and the first modification example, while omitting similarities in the configuration and operation.

2.2.1 Configuration

Figure 9:
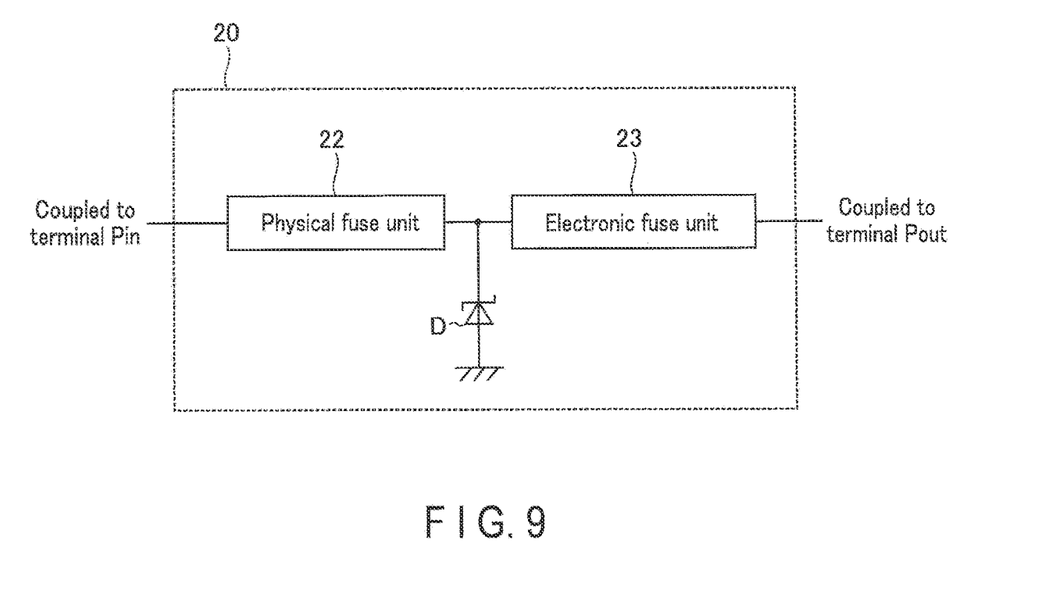
FIG. 9 is a block diagram explaining an exemplary configuration of the circuit in a semiconductor chip of a semiconductor device according to a second modification example.

By referring to FIG. 9, the configuration of the semiconductor device 1 according to the second modification example is explained. FIG. 9 is a block diagram explaining an exemplary configuration of the circuit included in the semiconductor chip of the semiconductor device according to the second modification example. In the semiconductor device 1 according to the second modification example, the bed portion 30, lead terminals 40, and wires 50 may have configurations similar to those of the embodiment and the first modification example, and therefore the explanation of these components is omitted. The following explanation of the configuration of the semiconductor chip 20 will focus mainly on differences with respect to the embodiment and the first modification example, and the rest of the configuration will be omitted from the explanation.

The semiconductor chip 20 according to the second modification example includes a diode D, in addition to the configuration of the embodiment and the first modification example. The diode D may be a zener diode. The portions of the configuration of the semiconductor chip 20 other than the diode D can be the same as the embodiment and the first modification example.

The first end (cathode) of the diode D is coupled between the physical fuse unit 22 and electronic fuse unit 23. The second end (anode) of the diode D is grounded. When the voltage at the first end of the diode D reaches the breakdown voltage of the diode D or higher, the diode D is turned to the ON state.

If the electronic fuse unit 23 has a configuration similar to that of the embodiment, the breakdown voltage of the diode D is set higher than or equal to the voltage at the first end of the diode D at the time of a current of the second current value I2 flowing through the physical fuse unit 22. The breakdown voltage of the diode D is also set lower than the voltage at the first end of the diode D at the time of a current of the first current value I1 flowing through the physical fuse unit 22. Preferably, the breakdown voltage of the diode D is set in close proximity to the voltage at the first end of the diode D at the time of the current of the second current value I2 flowing through the physical fuse unit 22.

If the electronic fuse unit 23 has a configuration similar to that of the first modification example, the breakdown voltage of the diode D is set to the voltage at the first end of the diode D or higher at the time of the voltage of the physical fuse unit 22 being the second voltage V2. In the following explanation, the breakdown voltage of the diode D is approximately equal to the voltage at the first end of the diode D at the time of the voltage of the physical fuse unit 22 being the second voltage V2.

2.2.2 Operations

Figure 10:
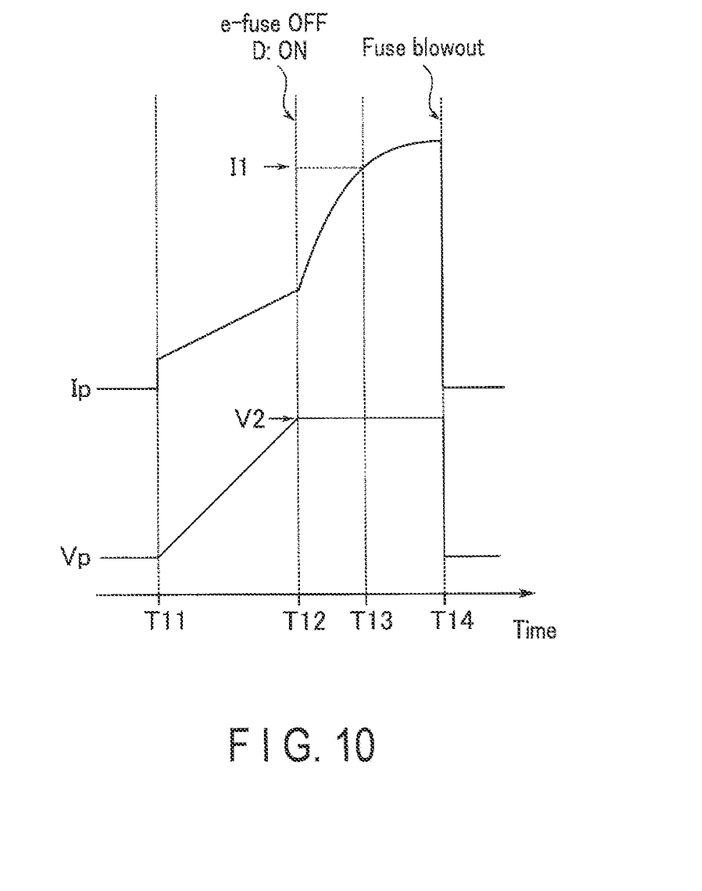
FIG. 10 is a timing chart explaining an exemplary operation using the semiconductor device according to the second modification example.

By referring to FIG. 10, the operation of the semiconductor device 1 according to the second modification example will be explained. FIG. 10 is a timing chart of the operation of the semiconductor device according to the second modification example. In FIG. 10, the operation of the physical fuse unit 22 and electronic fuse unit 23 having a configuration similar to that of the first modification example is explained. FIG. 10 shows the current value Ip and the voltage Vp of the physical fuse unit 22.

The operation at time T11 according to the embodiment is similar to the operation at time T6 according to the first modification example.

At time T12, the voltage Vp is approximately equal to the second voltage V2. In the same manner as in the first modification example at time T7, the electronic fuse unit 23 electrically insulates the terminal Pin and terminal Pout from each other ("e-fuse OFF" in FIG. 10) while maintaining the physical connection of the current path. As a result, the current from the terminal Pout is interrupted.

Furthermore, with the voltage of the physical fuse unit 22 reaching the second voltage V2, the diode D is turned to the ON state ("D: ON" in FIG. 10). That is, unlike the operation between time T7 and time T8 according to the first modification example, the diode D is turned to the ON state before the switch element Q1 is turned to the short-circuited state under an overvoltage applied to the first end of the switch element Q1. The current flowing in the semiconductor device 1 thereby starts flowing by way of the physical fuse unit 22 and diode D.

At time T13, the current value Ip becomes approximately equal to the first current value I1.

The current value Ip is maintained at the first current value I1 or higher between time T13 and time T14. As a result, at time T14, the physical fuse unit 22 blows ("Fuse blowout" in FIG. 10). That is, the physical fuse unit 22 physically cuts the current path off in order to electrically insulate the terminal Pin and electronic fuse unit 23 from each other. This interrupts the current flowing in the semiconductor device 1.

In accordance with the above, the operation of the semiconductor device 1 is completed.

In the above explanation, the operation of the physical fuse unit 22 and electronic fuse unit 23 having the same configurations as those of the first modification example has been described, which is not a limitation. If the physical fuse unit 22 and electronic fuse unit 23 have the same configurations as those of the embodiment, the operation substantially similar to the above operation can still be achieved.

2.2.3 Effects

According to the second modification example, the diode D turns to the ON state before the switch element Q1 turns to the short-circuited state. This can prevent an overcurrent from being supplied and an overvoltage from being applied to the electronic fuse unit 23. This can suppress the short-circuited state of the switch element Q1. In this manner, it is possible to more reliably suppress the destruction of surrounding apparatuses due to overcurrent.

2.3 Modification Example 3

According to the embodiment and the first and second modification examples, the physical fuse unit 22 (wiring pattern that may be burnt out) is arranged on the semiconductor chip 20, which is not a limitation. The physical fuse unit 22 may be arranged outside the semiconductor chip 20 in the semiconductor device 1.

Figure 11:
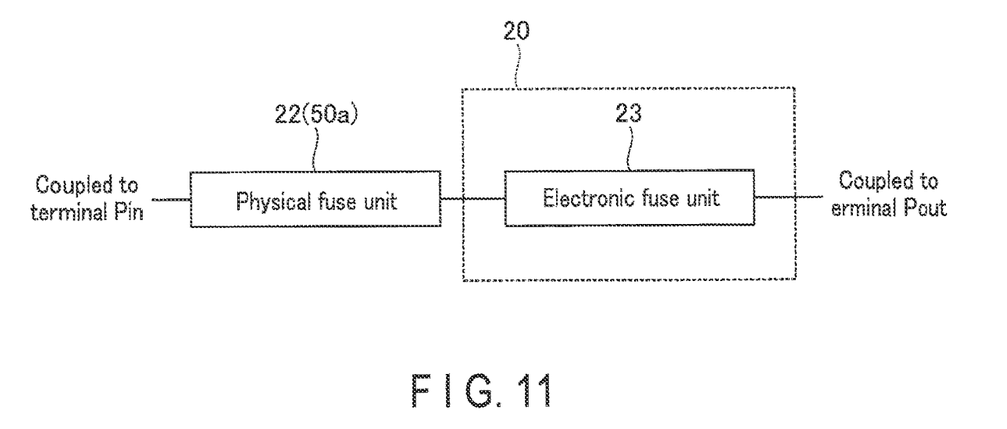
FIG. 11 is a block diagram explaining an exemplary configuration of a circuit in a semiconductor chip of a semiconductor device according to a third modification example.

Unlike the embodiment and the first and second modification examples, a wiring pattern to be burnt out is not provided on the semiconductor chip 20 in the semiconductor device 1 according to the third modification example, but the wires 50a provided upstream from the semiconductor chip 20 function as a physical fuse unit 22. In the semiconductor device 1 according to the third modification example, the bed portion 30 and lead terminals 40, and also the wires 50 except for the wires 50a can be configured to have the same configurations as the corresponding components of the embodiment and the first and second modification examples, and therefore the explanation of these components is omitted. In the following description, the configurations of the semiconductor chip 20 and wires 50a will be described, focusing on the differences with respect to the configurations of the embodiment and the first and second modification examples.

By referring to FIG. 11, the exemplary configuration of the semiconductor chip 20 according to the third modification example will be explained. FIG. 11 is a block diagram for explaining an exemplary configuration of the circuit included in the semiconductor chip of the semiconductor device according to the third modification example.

As illustrated in FIG. 11, the semiconductor chip 20 according to the third modification example does not include a wiring pattern to be burnt out. The electronic fuse unit 23 is coupled between the wires 50a, which function as the physical fuse unit 22, and the terminal Pout. The electronic fuse unit 23 may be configured to have the same configuration as the electronic fuse unit 23 of the embodiment and the first modification example.

The wires 50a are configured such that they may be burnt out based on the value of the current that flows through the wires 50a. In particular, the wires 50a are burnt out when the value of the current flowing through the wires 50a remains at the first current value I1 or higher over the first time period.

In the example of FIG. 11, the semiconductor chip 20 does not include a diode D. The semiconductor chip 20 according to the third modification example, however, may include a diode D in a manner similar to the semiconductor chip 20 according to the second modification example. In such a configuration, the first end of the diode D is coupled between the physical fuse unit 22 and electronic fuse unit 23, and the second end of the diode D is grounded in the same manner as in the configuration of the diode D according to the second modification example.

With such a configuration, effects similar to the embodiment and the first and second modification examples can be produced.

3. Others

In the above embodiment and the first and second modification examples, the semiconductor device 1 is a package, which is not a limitation. The semiconductor device 1 may be configured so that the semiconductor chip 20 is not sealed by an insulator. In particular, the semiconductor device 1 may include, in place of the lead terminals 40, ball-type (or bump-type) terminals connectable to electronic devices externally provided with respect to the semiconductor device 1 so that these ball-type (or bump-type) terminals will function as terminals Pin and Pout. The ball-type (or bump-type) terminals are arranged beneath the semiconductor chip 20, and therefore the semiconductor chip 20 may not require wires 50.

The embodiments of the present invention have been explained. These are presented merely as examples and are not intended to restrict the scope of the invention. These embodiments may be realized in various other forms, and various omissions, replacements, and changes can be made without departing from the gist of the invention. Such embodiments and modifications are included in the scope and gist of the invention, and are included in the scope of the invention described in the claims and its equivalents.

The invention claimed is:

1. A semiconductor device comprising:
   a first circuit;
   a first terminal;
   a second terminal;

a conductor and a first switch element serially coupled between the first terminal and the second terminal, a second switch element having a first end coupled to a node between the conductor and the first switch element, a gate coupled to a gate of the first switch element, and a second end;

a third switch element having a first end coupled to the second end of the second switch element, a gate, and a second end;

a first operational amplifier having a first input end coupled to a node between the second terminal and the first switch element, a second input end coupled between the second end of the second switch element and the first end of the third switch element, and an output end coupled to the gate of the third switch element; and a second operational amplifier having a first input end to which a third voltage is applied, a second end coupled to the second end of the third switch element, and an output end, wherein the first circuit is configured to turn the first switch element to an OFF state when a first condition is satisfied, the conductor is configured to physically break when a second condition is satisfied, and the first circuit includes a fourth switch element having a first end coupled to the gate of the first switch element, a gate coupled to the output end of the second operational amplifier, and a second end that is grounded.

2. The device of claim 1, further comprising:

a second circuit configured to output a voltage to the gate of the first switch element.

3. A semiconductor device comprising:

a first circuit;

a first terminal;

a second terminal;

a conductor and a first switch element serially coupled between the first terminal and the second terminal, a first operational amplifier having a first input end to which a first voltage is applied, a second input end coupled to a node between the conductor and the first switch element by way of a load, and an output end, wherein the first circuit is configured to turn the first switch element to an OFF state when a first condition is satisfied, the conductor is configured to physically break when a second condition is satisfied, and the first circuit includes a second switch element having a first end coupled to a gate of the first switch element, a gate coupled to the output end of the first operational amplifier, and a second end that is grounded.

4. The device of claim 3, further comprising:

a second circuit configured to output a voltage to the gate of the first switch element.

5. The device of claim 3, further comprising:

a third switch element having a first end coupled to the second input end of the first operational amplifier, a second end that is grounded, and a gate coupled to the second end.

6. The device of claim 5, wherein the third switch element is a junction field effect transistor.

* * * * *